(12) United States Patent
Man

(10) Patent No.: US 11,668,925 B2
(45) Date of Patent: Jun. 6, 2023

(54) MEMS MICRO-MIRROR DEVICE WITH STOPPER AND METHOD OF MAKING SAME

(71) Applicant: COMPERTUM MICROSYSTEMS INC., New Taipei (TW)

(72) Inventor: Francis Piu Man, Lexington, MA (US)

(73) Assignee: Compertum Microsystems Inc., Hsinchu (TW)

( * ) Notice: Subject to any disclaimer, the term of this patent is extended or adjusted under 35 U.S.C. 154(b) by 403 days.

(21) Appl. No.: 16/828,984

(22) Filed: Mar. 25, 2020

(65) Prior Publication Data

US 2021/0302717 A1 Sep. 30, 2021

(51) Int. Cl.
*B81B 3/00* (2006.01)
*G02B 26/08* (2006.01)

(52) U.S. Cl.
CPC ............ *G02B 26/085* (2013.01); *B81B 3/001* (2013.01); *B81B 3/0051* (2013.01); *B81B 2201/042* (2013.01)

(58) Field of Classification Search
CPC .......................... G02B 26/085; G02B 26/101; G02B 26/0833; B81B 3/001; B81B 3/0051; B81B 2201/042; B81B 2203/0109; B81B 2203/0154; B81B 7/02; B81C 3/00

See application file for complete search history.

(56) References Cited

U.S. PATENT DOCUMENTS

| | | | |
|---|---|---|---|
| 5,606,447 A | 2/1997 | Asada et al. | |
| 6,262,827 B1 * | 7/2001 | Ueda | G02B 26/0841 359/223.1 |
| 7,450,244 B2 | 11/2008 | Xie | |
| 2009/0244668 A1 | 10/2009 | Fujino et al. | |
| 2019/0121121 A1 | 4/2019 | Galinski, III et al. | |

* cited by examiner

*Primary Examiner* — Cuong B Nguyen
(74) *Attorney, Agent, or Firm* — Winston Hsu

(57) ABSTRACT

A MEMS micro-mirror device includes a middle substrate, a movable structure, at least one stopper coupled with the movable structure, at least one flexure, an upper cap, and a lower cap. The movable structure includes a micro-mirror plate having a reflective surface. The flexure connects the stopper and the middle substrate. The upper cap, bonded with the middle substrate, has a first opening for allowing the movable structure's movement and has at least one first recess facing a first side of the flexure and a first side of the stopper. The lower cap, bonded with the middle substrate, has a second opening for allowing space for the movement and has at least one second recess facing a second side of the flexure and a second side of the stopper.

30 Claims, 12 Drawing Sheets

MEMS MICRO-MIRROR DEVICE WITH STOPPER AND METHOD OF MAKING SAME

BACKGROUND OF THE INVENTION

1. Field of the Invention

The present invention relates generally to micro-electromechanical system (MEMS) devices and in particular to MEMS micro-mirrors.

2. Description of the Related Art

Micro-electromechanical systems (MEMS) micro-mirror device has many optical applications such as optical switches and optical scanning mirrors.

FIG. 1 illustrates a conventional one axis electromagnetic driven MEMS micro-mirror device comprising a planar movable plate 5 having a reflective mirror surface 8. The movable plate is supported axially by a torsional beam 6 to a silicon substrate 2. A coil 7 is placed around the movable plate such that when a current is applied to coil 7 under a magnetic field perpendicular to torsional beam 6 lengthwise, a Lorentz force is generated and acted on the movable plate such that the movable plate rotates about the torsional beam 6. A prior art example of such micro-mirror having these features is described in U.S. Pat. No. 5,606,447 "Planar type mirror galvanometer and method of manufacture," by Asada et. al., which is incorporated herein by reference.

FIG. 2 illustrates a conventional two-axis electromagnetic-driven MEMS micro-mirror device comprising an inner planar movable plate 5B having a reflective mirror surface 8, which is supported axially by a first torsional beam 6b to the outer planar movable plate 5A which is in turn supported axially by another torsional beam 6A to a substrate 2. A planar coil 7A is disposed on the outer movable plate 5A, such that when a current is applied to the planar coil 7A under a magnetic field perpendicular to the second torsional beam 6A, a Lorentz force is generated and acted on both outer and inner planar movable plate 5A 5B that rotate about second torsional beam 6A. Another planar coil 7B is disposed on the inner planar movable plate 5B, such that when a second current is applied to the planar coil 7B under a magnetic field perpendicular to the length of the first torsional beam 6B, another Lorentz force is generated and acted on the inner movable plate 5B such that the inner movable plate 5B rotates about the first torsional beam 6B. A prior art example of such micro-mirror having these features is described in U.S. Pat. No. 5,606,447 "Planar type mirror galvanometer and method of manufacture," by Asada et. al., which is incorporated herein by reference.

MEMS mirrors can be actuated by four mechanisms: thermal, electrostatic, piezoelectric, and electromagnetic. FIG. 3 is a conventional one-axis MEMS micro-mirror device having a movable micro-mirror surface wherein the micro-mirror is supported to the substrate by a flexure. In this example, the mirror is driven by an electro-thermal mechanism. The micro-mirror 310 is supported by a flexure 305 to a substrate. The flexure 305 comprises a poly-silicon heater, and an Aluminum silicon dioxide bimorph. To operate, a voltage is applied to voltage contacts, and when a current passes through the poly-silicon resistor, the poly-silicon resistor generates Joule heating to increase the flexure temperature causing the increase in bimorph temperature. Since the temperature expansion coefficients of the bimorph are different, it causes the flexure 305 bending leading to movement of the micro-mirror 310.

FIG. 4 is a conventional one-axis MEMS micro-mirror device 400 that is driven by an electrostatic mechanism. As shown in FIG. 4, the micro-mirror 410 is supported by a flexure (420a, 420b) to a substrate. The micro-mirror 410 comprises comb drive fingers (415a, 415b) which are coupled with corresponding comb drive fingers (430a, 430b) disposing on the substrate.

FIG. 5 is a conventional two-axis MEMS micro-mirror device 500 that is driven by piezoelectric mechanism. The micro-mirror device 500 comprises a substrate, two first flexures pivoting in one first axis, another two second flexures pivoting in one second axis, a micro-mirror, a gimbal, and a micro-mirror surface 510 disposed on said micro-mirror. The micro-mirror is supported by the first flexures to the gimbal which in turn supported by the second flexures to the substrate, wherein the first axis is substantially orthogonal to the second axis. A two-dimensional mirror scan (e.g., vertical scan (V-scan) or horizontal scan (H-scan)) can be controlled by applying oscillating electrical voltages $V_{ac}$ to respective piezoelectric actuators (e.g., piezoelectric actuators V or H).

Desirable feature for a MEMS micro-mirror package is shock immunity wherein shock may cause structural damage to the device. It is particularly imperative in large mirror scanning application, since large scanning angle calls for flexure(s) with low spring constant, which is more susceptible to shock. In the automotive industry, it is highly preferable for the MEMS mirror to withstand mechanical shock more than 100 g, or even 1000-1500 g (half-sinusoidal) within ~0.5 ms on each axis. However, most MEMS devices fail.

BRIEF SUMMARY OF THE INVENTION

An objective of the present disclosure is to provide a micro-electromechanical system (MEMS) micro-mirror device with at least one stopper so as to prevent a micro-mirror plate of the MEMS micro-mirror device from moving out of plane.

To achieve at least the above objective, the present disclosure provides a micro-electromechanical system (MEMS) micro-mirror device, comprising a middle substrate, a movable structure, at least one stopper, at least one flexure, an upper cap, and a lower cap. The movable structure includes a micro-mirror plate which has at least one reflective surface. The stopper is coupled with the movable structure. The flexure connects the stopper and the middle substrate. The upper cap, bonded with the middle substrate, has a first opening for allowing space for movement of the movable structure, and has at least one first recess for facing a first side of the flexure and a first side of the stopper. The lower cap, bonded with the middle substrate, has a second opening for allowing space for movement of the movable structure, and has at least one second recess for facing a second side of the flexure and a second side of the stopper.

In an embodiment, the first recess has a corresponding gap from the first side of the flexure so as to stop the flexure from moving out of plane upon exposing to shock.

In an embodiment, the second recess has a corresponding gap from the second side of the stopper so as to stop the flexure from moving out of plane upon exposing to shock.

In an embodiment, the stopper is coupled with the micro-mirror plate of the movable structure, wherein the micromirror plate is capable of being actuated to rotate in an axis that is defined by the flexure.

In an embodiment, the flexure is at least one first flexure, and the movable structure further includes a gimbal and at least one second flexure, connecting the micro-mirror plate and the gimbal, wherein the stopper is coupled with the gimbal of the movable structure, and the micro-mirror plate is capable of being actuated to rotate in a first axis defined by the first flexure and in a second axis defined by the second flexure.

In some embodiments, the MEMS micro-mirror device can further comprise at least one protrusion, disposed at a corresponding position on the upper cap, for facing the first side of the stopper.

In some embodiments, the MEMS micro-mirror device can further comprise at least one protrusion, disposed at a corresponding position on the lower cap, for facing the second side of the stopper.

In some embodiments, the MEMS micro-mirror device can further comprise at least one protrusion, disposed at a position on the first side of the stopper.

In some embodiments, the MEMS micro-mirror device can further comprise at least one protrusion, disposed at a position on the second side of the stopper.

In some embodiments, the MEMS micro-mirror device can further comprise at least one flexible portion, disposed at a corresponding position on the upper cap, for facing the first side of the stopper.

In some embodiments, the MEMS micro-mirror device can further comprise at least one flexible portion, disposed at a corresponding position on the lower cap, for facing the second side of the stopper.

In an embodiment, the corresponding thickness of the stopper can be configured to be substantially equal to that of the middle substrate.

In an embodiment, the micro-mirror plate has a spring constant which is determined, at least in part, based on the dimension of the flexure.

In an embodiment, the stopper has a corresponding thickness substantially greater than that of the flexure.

To achieve at least the above objective, the present disclosure provides a method of making a MEMS micro-mirror device, comprising: bonding one from an upper substrate and a lower substrate with a middle substrate so as to produce an intermediate assembly; and bonding the intermediate assembly with another from the upper substrate and the lower substrate, wherein at least one stopper is coupled with a movable structure including a micro-mirror plate which has at least one reflective surface; and at least one flexure is provided to connect the stopper and the middle substrate; wherein the upper substrate has a first opening for allowing space for movement of the movable structure and has at least one first recess for facing a first side of the flexure and a first side of the stopper; and wherein the lower substrate has a second opening for allowing space for movement of the movable structure and has at least one second recess for facing a second side of the flexure and a second side of the stopper.

In an embodiment of the method, the flexure is at least one first flexure, and the movable structure further includes: a gimbal, and at least one second flexure, connecting the micro-mirror plate and the gimbal, wherein the stopper is coupled with the gimbal of the movable structure and the micro-mirror plate is capable of being actuated to rotate in a first axis defined by the first flexure and in a second axis defined by the second flexure.

In an embodiment of the method, the upper substrate is provided with at least one protrusion, which is disposed at a corresponding position on the upper substrate, for facing the first side of the stopper.

In an embodiment of the method, the lower substrate is provided with at least one protrusion, which is disposed at a corresponding position on the lower substrate, for facing the second side of the stopper.

In an embodiment of the method, the stopper is provided with at least one protrusion which is disposed at a position on the first side of the stopper.

In an embodiment of the method, the stopper is provided with at least one protrusion which is disposed at a position on the second side of the stopper.

In some embodiments, a MEMS package can be provided, comprising a MEMS micro-mirror device, as described in any one of the embodiments of the present disclosure or any combination thereof, a light source, and an on-package optical angle sensor.

DETAILED DESCRIPTION OF THE INVENTION

Preferred embodiments of the present disclosure will be described below with reference to the accompanying drawing. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein. Accordingly, while a brief overview is provided, certain aspects of the subject disclosure are described or depicted herein for the purposes of illustration and not limitation. Thus, variations of the disclosed embodiments as suggested by the disclosed apparatuses, systems, and methodologies are intended to be encompassed within the scope of the subject matter disclosed herein.

Various embodiments of a micro-electromechanical system (MEMS) micro-mirror device with at least one stopper will be provided so as to prevent a micro-mirror plate of the MEMS micro-mirror device from moving out of plane.

As will be illustrated below, a micro-electromechanical system (MEMS) micro-mirror device includes a middle substrate, a movable structure, at least one stopper, at least one flexure, an upper cap, and a lower cap. The movable structure includes a micro-mirror plate having at least one reflective surface, wherein the micro-mirror plate may be configured to be actuated for a one-axis or two-axis rotation.

In some embodiments of the MEMS micro-mirror device as described below, a one-dimensional (1D) MEMS micro-mirror device 900 is provided with top and bottom caps and stoppers, wherein the micro-mirror plate may be configured to be actuated for a one-axis rotation.

Figure 1:
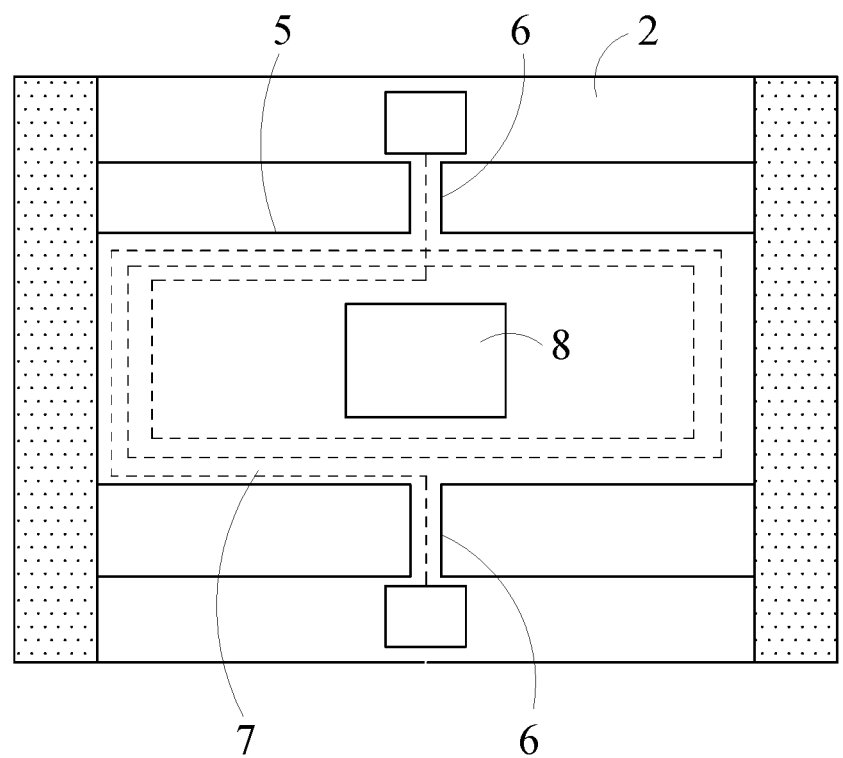
FIG. 1 (PRIOR ART) is a conventional schematic representation of a 1D electromagnetic driven MEMS micro-mirror.
Figure 2:
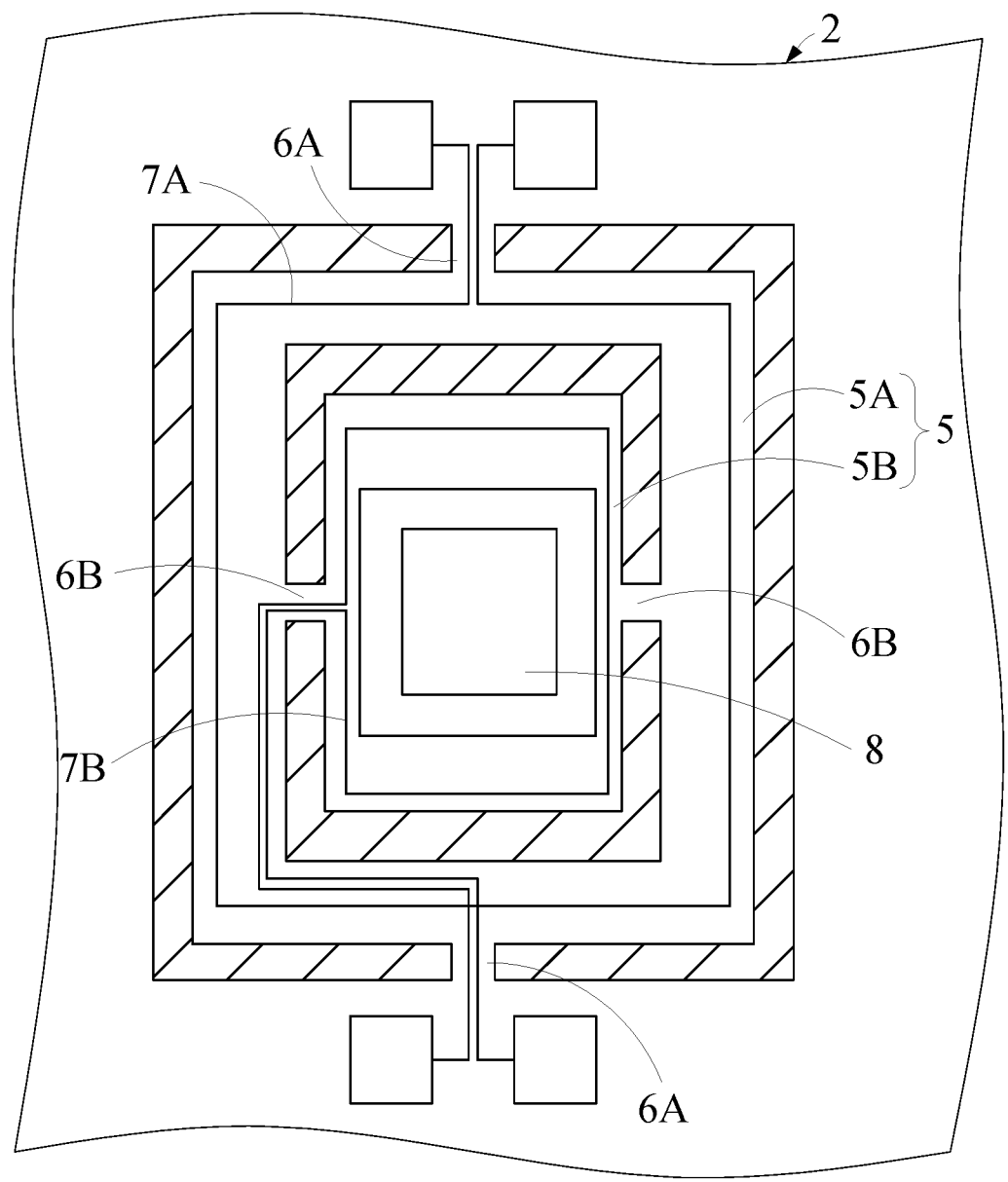
FIG. 2 (PRIOR ART) is a schematic representation of a 2D electromagnetic driven MEMS micro-mirror.
Figure 3:
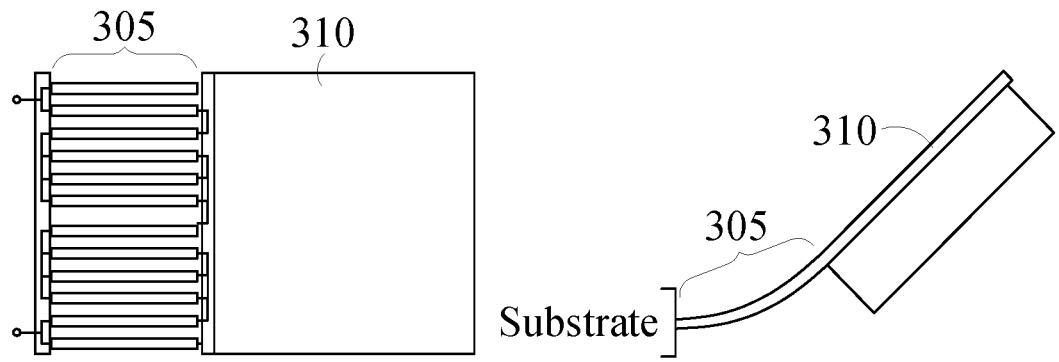
FIG. 3 (PRIOR ART) is a schematic representation of a 1D thermal driven MEMS micro-mirror package.
Figure 4:
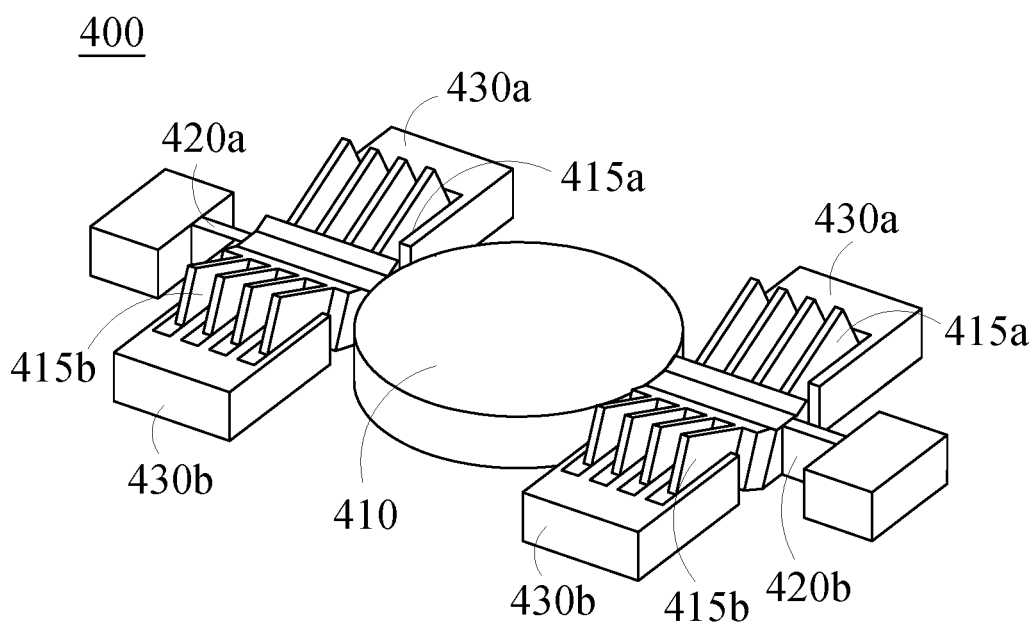
FIG. 4 (PRIOR ART) is a schematic representation of a 1D electrostatic driven MEMS micro-mirror package.
Figure 5:
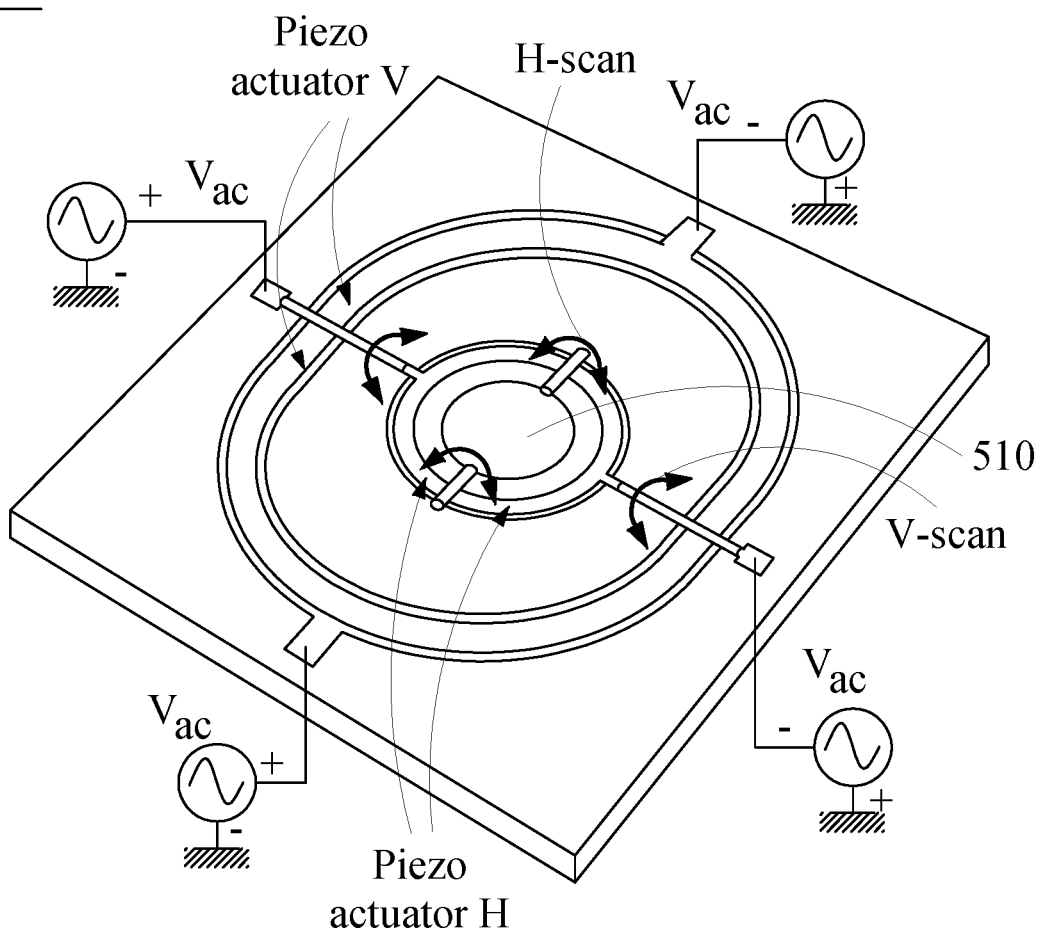
FIG. 5 (PRIOR ART) is a schematic representation of a 1D piezoelectric driven MEMS micro-mirror package.
Figure 6A:
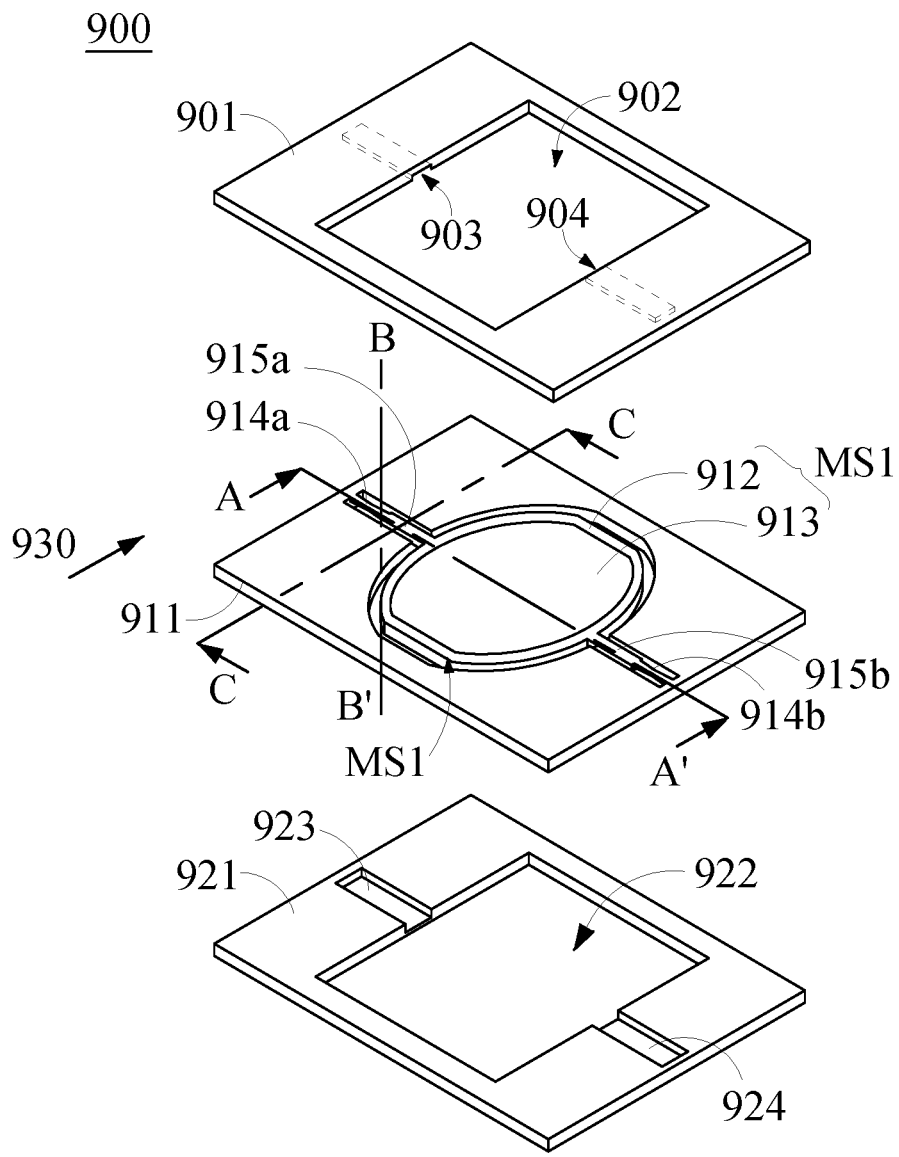
FIG. 6A is an exploded schematic view illustrating an embodiment of a 1D MEMS micro-mirror device with an upper cap, a lower cap, and stoppers.
Figure 6B:
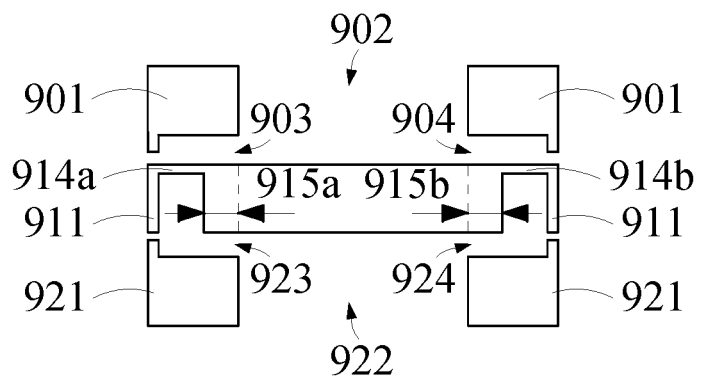
FIG. 6B is a cross-sectional view of the 1D MEMS micro-mirror device, taken along line A-A' as shown in FIG. 6A.

Referring to FIG. 6A, an embodiment of the 1D MEMS micro-mirror device 900 is illustrated with top and bottom caps and stoppers in an exploded schematic view. FIG. 6B shows the 1D MEMS micro-mirror device in a cross-sectional view taken along line A-A' as shown in FIG. 6A. Referring to FIGS. 6A and 6B, the 1D MEMS micro-mirror device 900 includes a middle substrate 911, a movable structure MS1, at least one stopper (e.g., 915a, 915b), at least one flexure (e.g., 914a, 914b), an upper cap 901, and a lower cap 921. The movable structure MS1 includes a micro-mirror plate 912 having at least one reflective surface 913, for example, such as at least one from a front-side surface and a rear-side reflective surface.

As illustrated in FIGS. 6A and 6B, the 1D MEMS micro-mirror device 900 includes two stoppers 915a, 915b which are coupled with the movable structure MS1. The 1D MEMS micro-mirror device 900 also includes two flexures 914a, 914b, each of which connects the stoppers 915a, 915b and the middle substrate 911. In this embodiment, the stoppers 915a, 915b are coupled with the micro-mirror plate 912 of the movable structure MS1, as shown in the embodiment of FIGS. 6A and 6B.

For example, the stoppers 915a, 915b each have a corresponding thickness substantially greater than that of the flexure 914a, 914b. The thicknesses of the stoppers 915a, 915b may be the same or different substantially. Certainly, the implementation of the invention is not limited to the above examples.

The upper cap 901, bonded with the middle substrate 911, has a first opening 902 and at least one first recess (e.g., 903, 904). The first opening 902 is used for allowing space for movement of the movable structure MS1; and the upper cap 901 includes two first recesses 903, 904 each of which faces a first side (e.g., an upper side as illustrated in FIGS. 6A and 6B) of the flexures 914a, 914b and a first side (e.g., an upper side as illustrated in FIGS. 6A and 6B) of the stoppers 915a, 915b.

The lower cap 921, bonded with the middle substrate 911, has a second opening 922 and at least one second recess (e.g., 923, 924). The second opening 922 is used for allowing space for movement of the movable structure MS1; and the lower cap 921 includes two second recess 923, 924 each facing a second side (e.g., a lower side as illustrated in FIGS. 6A and 6B) of the flexures 914a, 914b and a second side (e.g., a lower side as illustrated in FIGS. 6A and 6B) of the stoppers 915a, 915b.

As illustrated in FIGS. 6A and 6B, for example, the micro-mirror plate 912 is capable of being actuated to rotate in an axis that is defined by the flexures 914a, 914b. In some embodiments, the 1D MEMS micro-mirror device 900 may further include an actuation mechanism which can be, but not limited to, electromagnetic, piezoelectric, electrostatic, or thermal mechanism, such that the micro-mirror plate 912 is actuated to rotate in an axis AA' that is defined by the flexures 914a, 914b.

In one of the embodiments that an actuation mechanism employed is electromagnetic, the MEMS micro-mirror device 900 may further include at least one magnet that provides a magnetic field, indicated by arrow 930, such that the movable structure (e.g., MS1) or micro-mirror plate 912 can be driven by electromagnetic actuation under the magnetic field. For example, at least one coil can be disposed around the movable structure (e.g., MS1) such that when a current is applied to the coil under the magnetic field perpendicular to the flexure (e.g., 914a, 914b) lengthwise, a Lorentz force is generated and acted on the movable structure (e.g., MS1) such that the movable structure (e.g., MS1) or micro-mirror plate 912 rotates about the axis AA'. The actuation mechanism such as the coil and the magnet, as mentioned above, may be implemented in accordance with the conventional or any appropriate approach, and will not be shown and detailed for the sake of brevity. Certainly, the implementation of the invention is not limited to the above examples. For example, the actuation mechanism may be implemented or regarded as environmental components with respect to the MEMS micro-mirror device 900 as shown in FIGS. 6A and 6B.

In the embodiment of the 1D MEMS micro-mirror device 900 in FIGS. 6A and 6B, the recesses can prevent damage of the corresponding one of the flexures. For example, the first recesses 903, 904 each have a corresponding gap from the first side of the flexures 914a, 914b so as to stop the flexures 914a, 914b from moving out of plane upon exposing to shock (e.g., in the direction as indicated by line B-B' in FIG. 6A, wherein line B-B' is perpendicular to line A-A' and line C-C'). The second recesses 923, 924 each have a corresponding gap from the second side of the stoppers 915a, 915b so as to stop the flexures 914a, 914b from moving out of plane upon exposing to shock (e.g., in the direction as indicated by line B-B' in FIG. 6A).

Figure 7A:
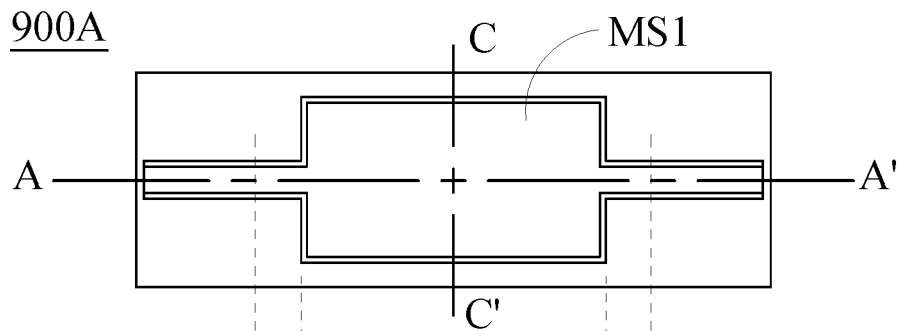
FIG. 7A is a schematic top view illustrating an embodiment of a 1D MEMS micro-mirror device with an upper cap, a lower cap, and stoppers, in accordance with that as shown in FIGS. 6A and 6B.
Figure 7B:
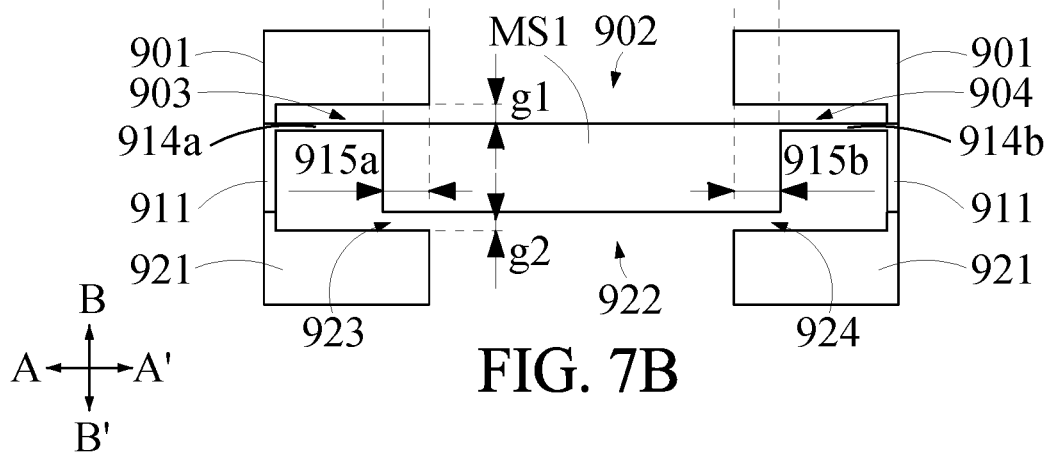
FIG. 7B is a cross-section view of the embodiment, taken along line A-A' as shown in FIG. 7A.

Regarding the prevention of damage of the flexures, referring to FIG. 7A, an embodiment of a 1D MEMS micro-mirror device 900A with an upper cap, a lower cap, and stoppers, is shown in accordance with that as shown in FIGS. 6A and 6B in a schematic top view, wherein the movable structure MS1 is illustrated in the shape of a rectangle. FIG. 7B is a cross-section view of the embodiment, taken along line A-A' as shown in FIG. 7A, and can correspond to that shown in FIG. 6B, wherein the components of the 1D MEMS micro-mirror device are indicated using the same reference signs for the similar components as shown in FIG. 6B, for the sake of illustration.

Figure 7C:
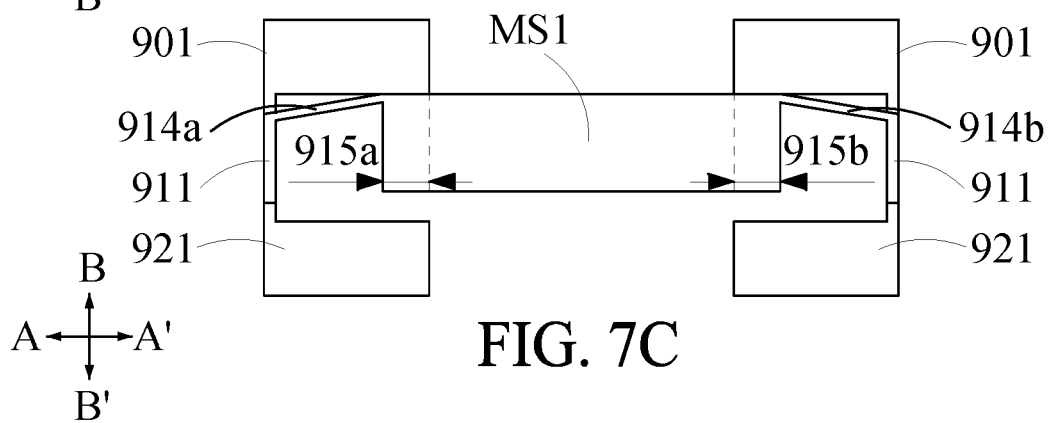
FIG. 7C is a schematic diagram illustrating the operation of the 1D MEMS micro-mirror device as shown in FIG. 7B.
Figure 7D:
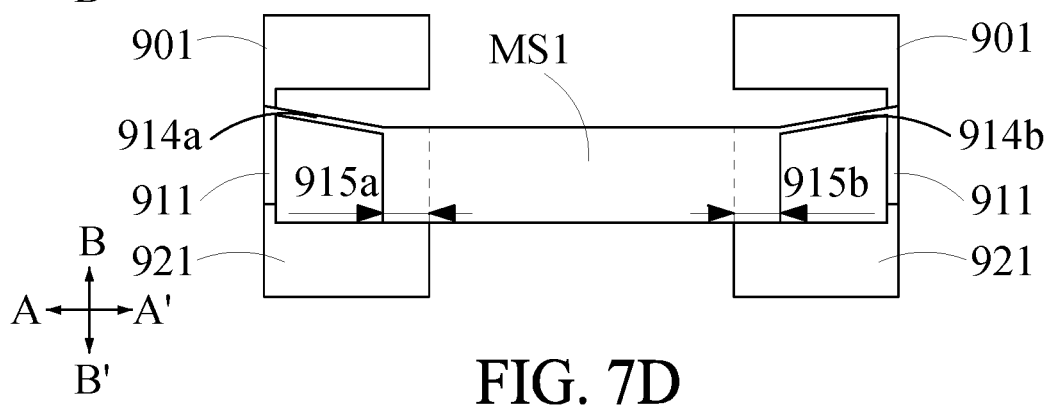
FIG. 7D is a schematic diagram illustrating the operation of the 1D MEMS micro-mirror device as shown in FIG. 7B.

As shown in FIG. 7B (or FIG. 6B), the middle substrate 911 is bonded with the upper cap 901 and lower cap 921, leaving a gap (e.g., with a gap distance indicated by g1) between a surface of the upper cap 901 for the first recess 903 and the upper side (or surface) of the flexure 914a, and also leaving a gap (e.g., with a gap distance indicated by g2) between the lower side (or surface) of the stopper 915a and a surface of the lower cap 921 for the second recess 923. Upon exposing shock in B-direction, as illustrated in FIG. 7C, the movable structure MS1 (or the micro-mirror plate 912) moves vertically (e.g., in B-direction) and is stopped leaving at least one of the stoppers 915a, 915b resting on the surface for the first recess 903. Similarly, upon exposing shock in B'-direction, as illustrated in FIG. 7D, the movable structure MS1 (or the micro-mirror plate 912) moves vertically (e.g., in B'-direction) and is stopped leaving at least one of the stoppers 915a, 915b resting on the surface for the second recess 923.

In an embodiment, the corresponding thickness of each of the stoppers 915a, 915b can be configured to be substantially equal to that of the middle substrate 911. For example, the stoppers 915a, 915b each have a thickness similar to the middle substrate 911 such that the stoppers 915a, 915b is strong enough and is immune to damage unlike a thin flexure(s) which is coupled with the movable structure MS1 without the stopper(s) and is prone to shock-induced damage. Certainly, the implementation of the invention is not limited to the above examples. In an embodiment, the corresponding thickness of each of the stoppers 915a, 915b can be configured to be substantially less than that of the middle substrate 911 and substantially greater than that of the flexure 914a, 914b.

In the following embodiments, the MEMS micro-mirror device may further include at least one protrusion for further prevention of damage thereof.

In some embodiments, the MEMS micro-mirror device (e.g., 900 or 900A) can further comprise at least one protrusion, disposed at a corresponding position on the upper cap 901, for facing the first side of the stopper (e.g., 915a, 915b).

In some embodiments, the MEMS micro-mirror device (e.g., 900 or 900A) can further comprise at least one protrusion, disposed at a corresponding position on the lower cap 921, for facing the second side of the stopper (e.g., 915a, 915b).

In some embodiments, the MEMS micro-mirror device (e.g., 900 or 900A) can further comprise at least one protrusion, disposed at a position on the first side of the stopper (e.g., 915a, 915b).

In some embodiments, the MEMS micro-mirror device can further comprise at least one protrusion, disposed at a position on the second side of the stopper (e.g., 915a, 915b).

Figure 8A:
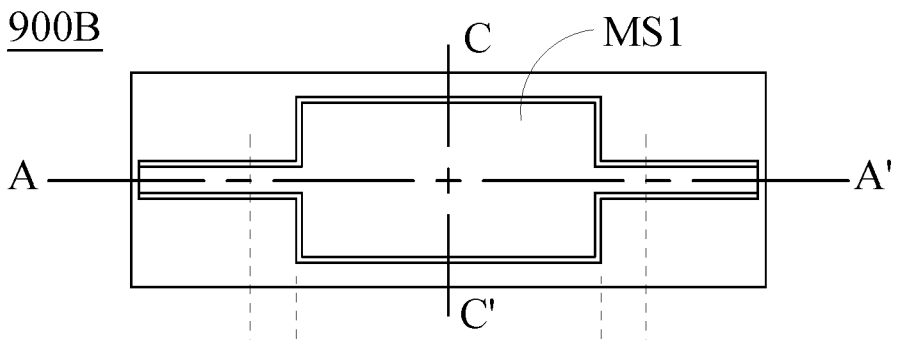
FIG. 8A is a schematic top view illustrating an embodiment of a 1D MEMS micro-mirror device with an upper cap, a lower cap, and stoppers, in accordance with that as shown in FIG. 6A, and further with protrusions on the top and bottom caps.
Figure 8B:
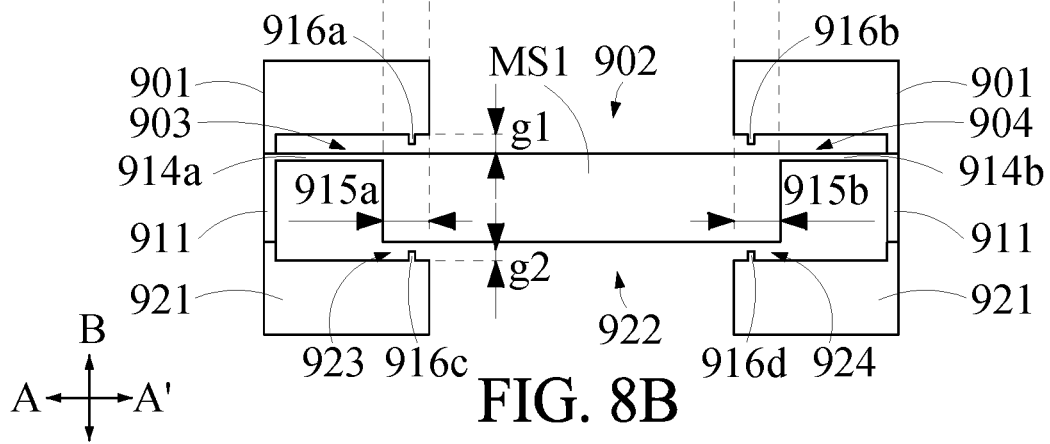
FIG. 8B is a cross-section of the embodiment, taken along line A-A' as shown in FIG. 8A.

Regarding the protrusions, referring to FIG. 8A, an embodiment of a 1D MEMS micro-mirror device 900B with an upper cap, a lower cap, and stoppers, in accordance with that as shown in FIG. 6A, and further with protrusions on the upper and lower caps, is illustrated in a schematic top view, wherein the movable structure MS1 is illustrated in the shape of a rectangle similar to that of FIG. 7A. FIG. 8B is a cross-section view of the embodiment, taken along line A-A' as shown in FIG. 8A, and can correspond to that shown in FIG. 6B, the components of the 1D MEMS micro-mirror device are indicated using the same reference signs for the similar components as shown in FIG. 6B, for the sake of illustration.

As shown in FIG. 8B, the MEMS micro-mirror device 900B (e.g., 900 or 900A) can further include at least one protrusion (e.g., 916a, 916b), disposed at a corresponding position on the upper cap 901 facing the first side of the stopper (e.g., 915a, 915b). The MEMS micro-mirror device 900B (e.g., 900 or 900A) can further include at least one protrusion (e.g., 916c, 916d), disposed at a corresponding position on the lower cap 921 facing the second side of the stopper (e.g., 915a, 915b). For example, the protrusion may be implemented by using one or more pimples or any appropriate element in protruding or convex shape, resided or configured on an inner surface of the upper cap 901 (or upper substrate), or that of lower cap 921 (or lower substrate), which defines the corresponding recess (e.g., 903, 904, 923 or 924).

Figure 8C:
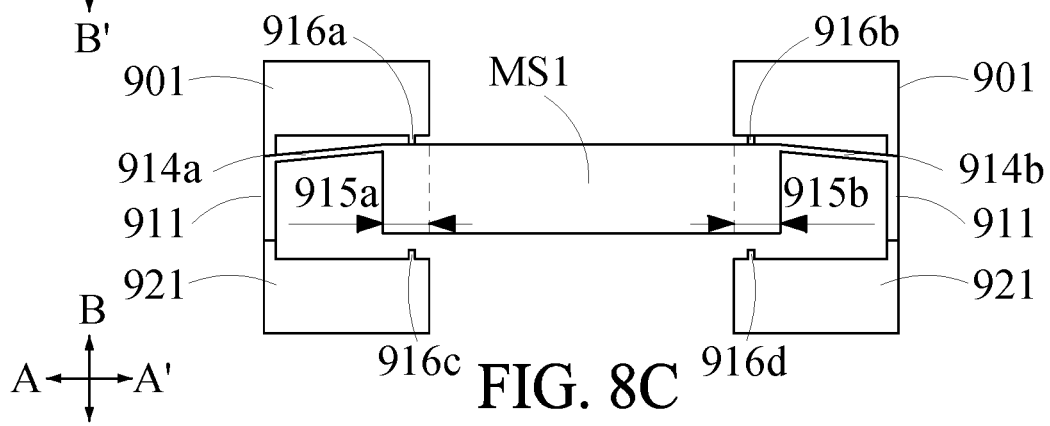
FIG. 8C is a schematic diagram illustrating the operation of the 1D MEMS micro-mirror device as shown in FIG. 8B.
Figure 8D:
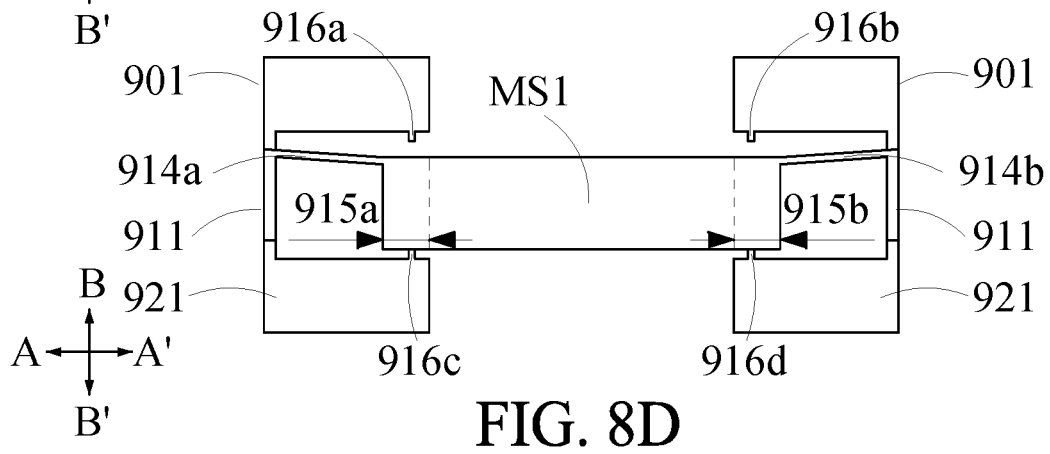
FIG. 8D is a schematic diagram illustrating the operation of the 1D MEMS micro-mirror device as shown in FIG. 8B.

Regarding the operation of at least one protrusion for further prevention of damage, upon exposed to shock in direction of B, the movable structure MS1 (or the micro-mirror plate 912) moves in the direction of B and stops when the protrusions 916a, 916b rest on the stoppers 915a, 915b, as shown in FIG. 8C. Similarly, when exposed to shock in direction of B', the movable structure MS1 (or the micro-mirror plate 912) moves in the direction of B' and stops when the protrusions 916c, 916d rest on the stoppers 915a, 915b, as shown in FIG. 8D.

Figure 9A:
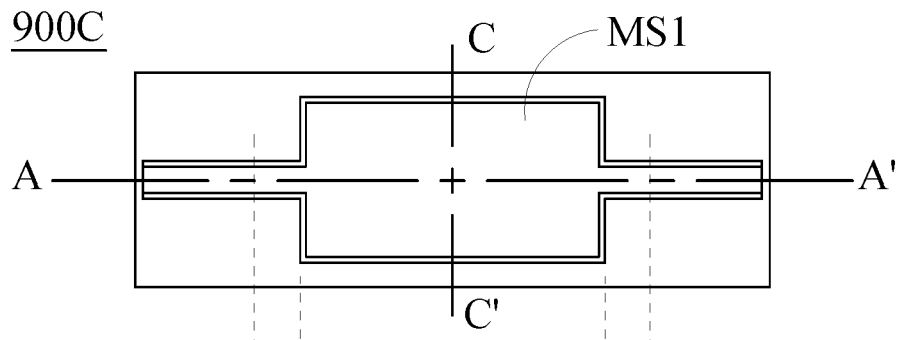
FIG. 9A is a schematic top view illustrating an embodiment of a 1D MEMS micro-mirror device with an upper cap, a bottom cap, and stoppers, in accordance with that as shown in FIG. 6A, and further with protrusions on the stoppers.
Figure 9B:
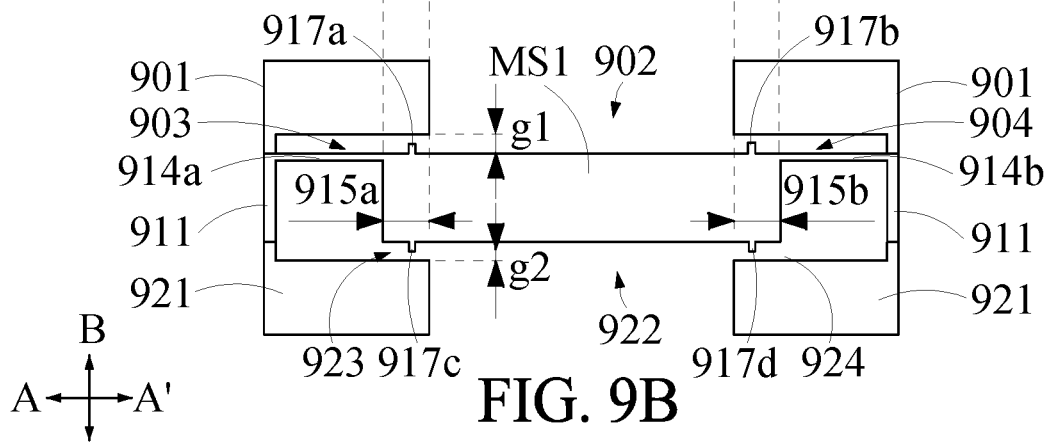
FIG. 9B is a cross-section of the embodiment, taken along line A-A' as shown in FIG. 9A.
Figure 9C:
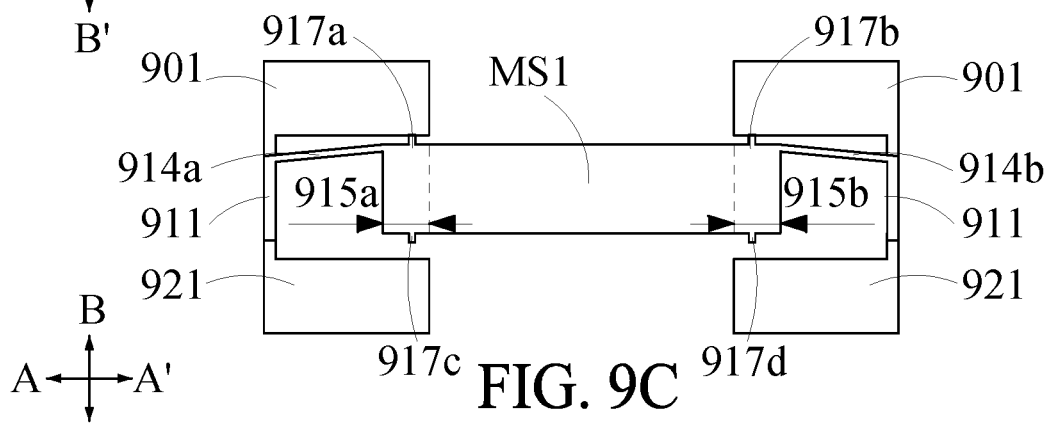
FIG. 9C is a schematic diagram illustrating the operation of the 1D MEMS micro-mirror device as shown in FIG. 9B.

Referring to FIG. 9A, an embodiment of a 1D MEMS micro-mirror device 900C with an upper cap, a lower cap, and stoppers, in accordance with that as shown in FIG. 6A or 7A, and further with protrusions on the stoppers, is illustrated in a schematic top view. FIG. 9B is a cross-section view of the embodiment, taken along line A-A' as shown in FIG. 9A, and can correspond to that shown in FIG. 6B or 7B, the components of the 1D MEMS micro-mirror device are indicated using the same reference signs for the similar components as shown in FIG. 6B, for the sake of illustration.

As shown in FIG. 9B, the MEMS micro-mirror device 900C (e.g., 900 or 900A) can further comprise at least one protrusion (e.g., 917a, 917b), disposed at a position on the first side of the stopper (e.g., 915a, 915b). The MEMS micro-mirror device 900C (e.g., 900 or 900A) can further comprise at least one protrusion (e.g., 917c, 917d), disposed at a position on the second side of the stopper (e.g., 915a, 915b). For example, the protrusion may be implemented by using one or more pimples or any appropriate element in protruding or convex shape, resided or configured on a surface of the stopper (e.g., 915a, 915b) facing the surface of the upper cap 901 (or upper substrate), or that of the lower cap 921 (or lower substrate), which defines the corresponding recess.

Figure 9D:
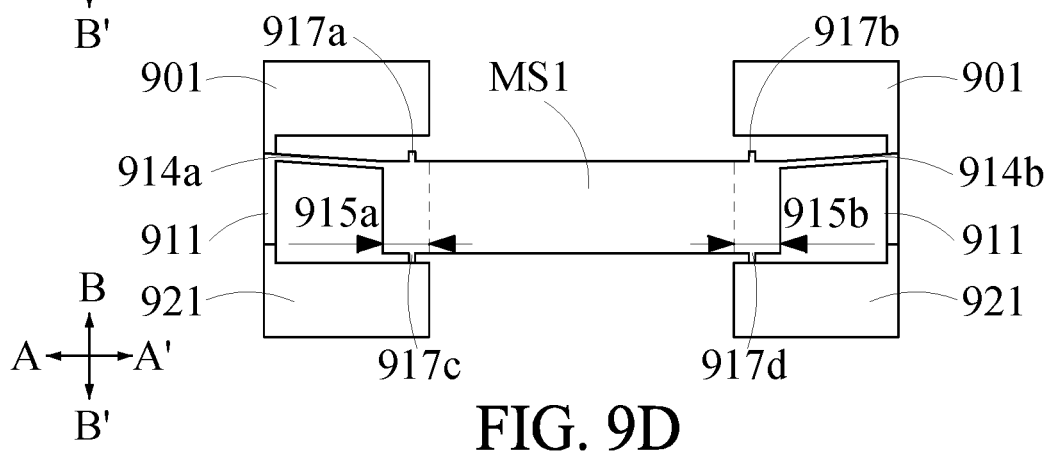
FIG. 9D is a schematic diagram illustrating the operation of the 1D MEMS micro-mirror device as shown in FIG. 9B.

Regarding the operation of at least one protrusion for further prevention of damage, upon exposed to shock in direction of B, the movable structure MS1 (or the micromirror plate 912) moves in the direction of B and stops when the protrusions 917a, 917b rest on the surface of the upper cap 901 for the first recesses 903, as shown in FIG. 8C. Similarly, when exposed to shock in direction of B', the movable structure (or the micro-mirror plate 912) moves in the direction of B' and stops when the protrusions 917c, 917d rest on the surface of the lower cap 921 for the second recesses 923, as shown in FIG. 9D.

As illustrated in the above embodiments with at least one protrusion, the purposes of the protrusion(s) are two folds. First, the portion of the flexure (e.g., 914a, 914b) can be prevented from hitting the surface of the upper cap 901 for the first recesses 903 that might cause flexure breakage. Secondly, the contact surface between the surface of the upper cap 901 for the first recess (e.g., 903, 904) (or that of the lower cap 921 for the second recess (e.g., 923, 924) and stopper (e.g., 915a, 915b) can be decreased, thus reducing stiction effect. Stiction might occur when there is contact between two surfaces causing permanent adhesion.

In some embodiments of a MEMS micro-mirror device as described below, a two-dimensional (2D) MEMS micromirror device 1000 is provided with top and bottom caps and stoppers, wherein a micro-mirror plate thereof may be configured to be actuated for two one-axis rotation.

Figure 10A:
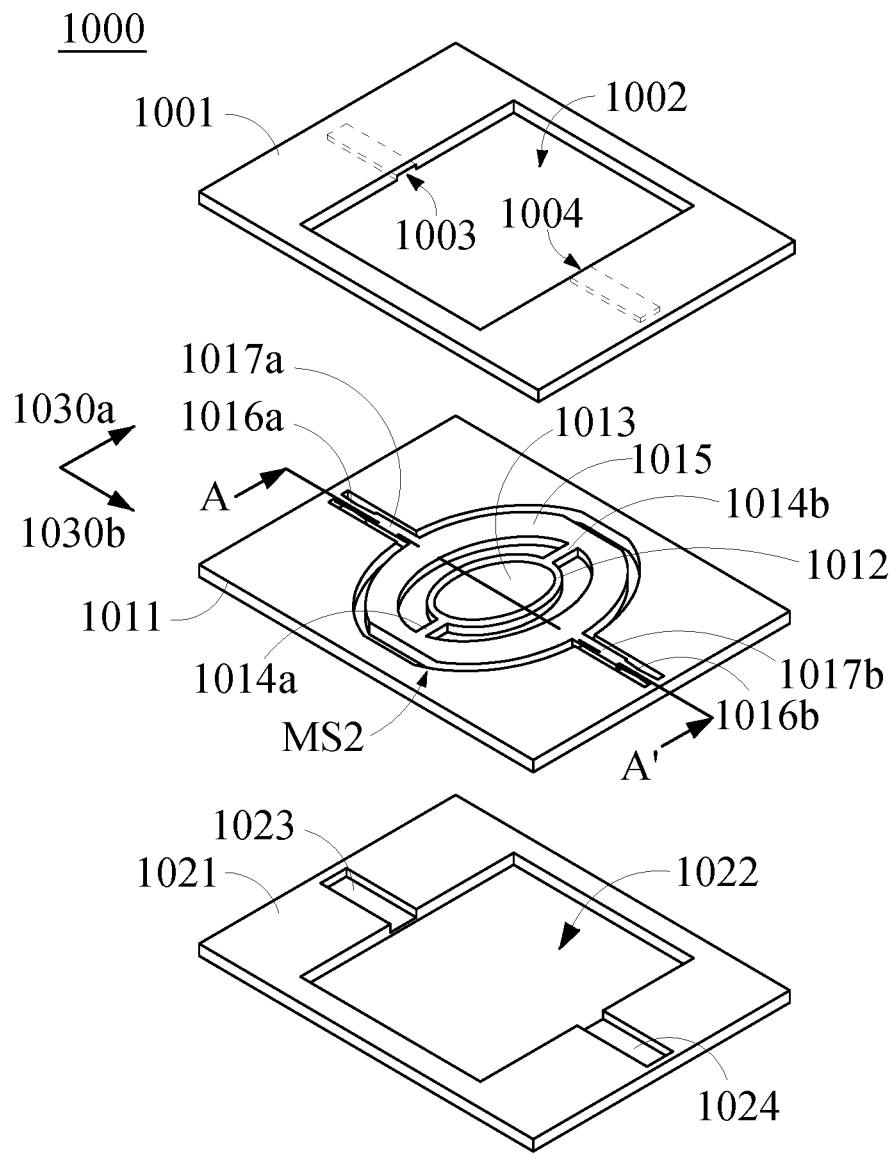
FIG. 10A is an exploded schematic view illustrating an embodiment of a 2D MEMS micro-mirror device with an upper cap, a lower cap, and stoppers.
Figure 10B:
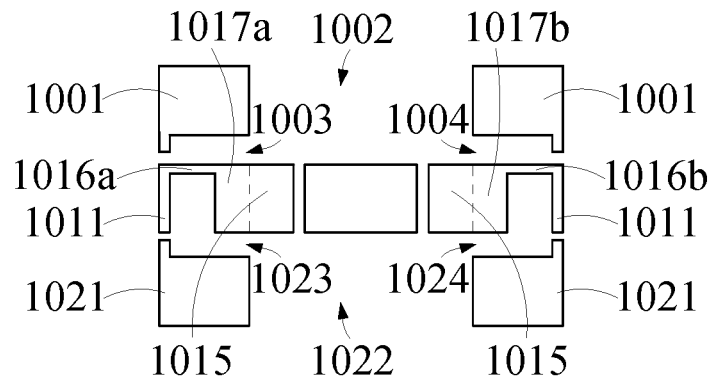
FIG. 10B is a cross-sectional view of the 2D MEMS micro-mirror device, taken along line A-A' as shown in FIG. 10A.

Referring to FIG. 10A, an embodiment of the 2D MEMS micro-mirror device 1000 is illustrated with top and bottom caps and stoppers in an exploded schematic view. FIG. 10B shows the 2D MEMS micro-mirror device 1000 in a cross-sectional view taken along line A-A' as shown in FIG. 10A. Referring to FIGS. 10A and 10B, the 2D MEMS micromirror device 1000 includes a middle substrate 1011, a movable structure MS2, at least one stopper (e.g., 1017a, 1017b), at least one flexure (e.g., 1016a, 1016b), an upper cap 1001, and a lower cap 1021. The movable structure MS2 includes a micro-mirror plate 1012 having at least one reflective surface 1013, for example, such as at least one from a front-side surface and a rear-side reflective surface.

Referring to FIGS. 10A and 10B, the 2D MEMS micromirror device 1000 differs from the MEMS micro-mirror device of FIGS. 6A and 6B in that the movable structure MS2 further includes a gimbal 1015 and at least one flexure (1014a, 1014b), connecting the micro-mirror plate 1012 and the gimbal 1015. In FIGS. 10A and 10B the 2D MEMS micro-mirror device 1000 includes the stoppers 1017a, 1017b coupled with the gimbal 1015 of the movable structure MS2.

As illustrated in FIGS. 10A and 10B, for example, the micro-mirror plate 1012 is capable of being actuated to rotate in a first axis (e.g., indicated by an arrow 1030b) defined by the flexure (or referred to as first flexure; e.g., 1016a, 1016b,) and/or in a second axis (e.g., indicated by an arrow 1030a) defined by the flexure (or referred to as second flexure; e.g., 1014a, 1014b). In some embodiments, the 2D MEMS micro-mirror device 1000 may further include an actuation mechanism which can be, but not limited to, electromagnetic, piezoelectric, electrostatic, and thermal mechanism, such that the micro-mirror plate 1012 is actuated to rotate in the first axis and/or in the second axis.

In one of the embodiments that an actuation mechanism employed is electromagnetic, the 2D MEMS micro-mirror device 1000 may further include a magnet that provides a magnetic field, such that the micro-mirror plate 1012 can be driven by electromagnetic actuation under the magnetic field. For example, at least one coil can be disposed around the movable structure MS2 (e.g., the gimbal 1015 or micromirror plate 1012) such that when a current is applied to the coil under the magnetic field perpendicular to the flexure lengthwise, a Lorentz force is generated and acted on the movable structure such that the gimbal 1015 or micro-mirror plate 1012 rotates about the first or second axis. The actuation mechanism such as the coil and the magnet, as mentioned above, may be implemented in accordance with the conventional or any appropriate approach, and will not be shown and detailed for the sake of brevity. Certainly, the implementation of the invention is not limited to the above examples. For example, the actuation mechanism may be implemented or regarded as environmental components with respect to the 2D MEMS micro-mirror device 1000 as shown in FIGS. 10A and 10B.

Because the 2D MEMS micro-mirror device 1000 of FIGS. 10A and 10B differs from the MEMS micro-mirror device of FIGS. 6A and 6B in that the movable structure MS2, the 2D MEMS micro-mirror device 1000 can share the same operation for the prevention of the damage of the flexures thereof. Further, the embodiments regarding at least one protrusion for further prevention of the damage can be applied to any embodiment in accordance with the 2D MEMS micro-mirror device 1000. For the sake of brevity, the related description will not be repeated.

In the following, embodiments of the MEMS micromirror device (e.g., based on that indicated by 900, 900A, 900B, 900C, or 1000) further including one or more flexible portions are provided for additional prevention of damage thereof. The flexible portion is capable of relieving the stopper (e.g., 923 or 924; 1023 or 1024) from a shock-induced impact on the stopper.

Figure 11A:
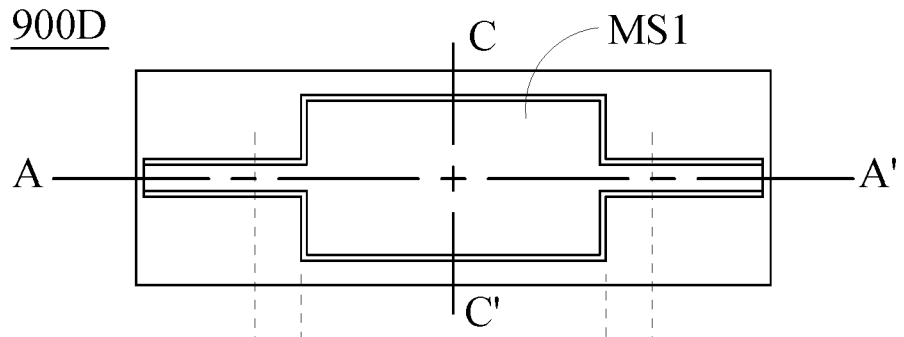
FIG. 11A is a schematic top view illustrating an embodiment of a 1D MEMS micro-mirror device with an upper cap, a lower cap, and stoppers, in accordance with that as shown in FIGS. 6A and 6B, and further with flexible portions on the upper and lower caps.
Figure 11B:
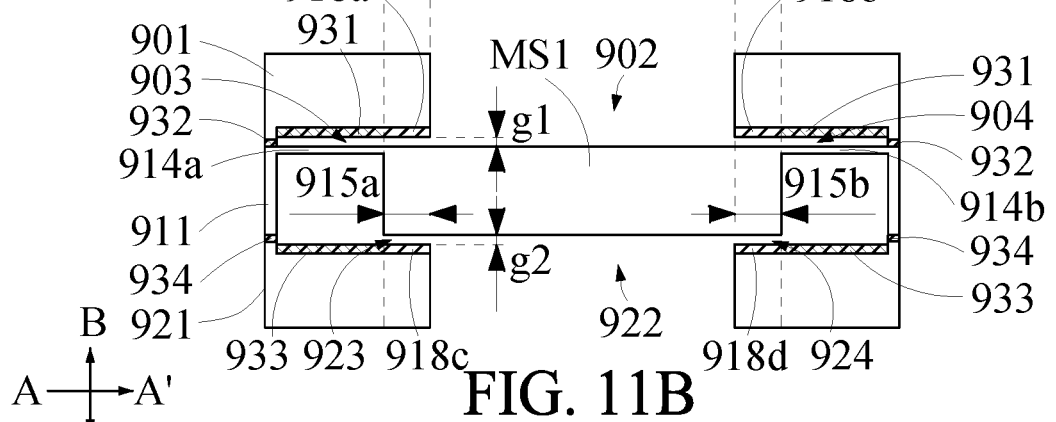
FIG. 11B is a cross-section of the embodiment, taken along line A-A' as shown in FIG. 11A.

Regarding the flexible portion, referring to FIG. 11A, an embodiment of a 1D MEMS micro-mirror device 900D with an upper cap, a lower cap, and stoppers, in accordance with that as shown in FIGS. 6A and 6B (or FIGS. 7A and 7B), and further with flexible portions on the top and bottom caps, is illustrated in a schematic top view, wherein the movable structure MS1 is illustrated in the shape of a rectangle similar to that of FIG. 7A. FIG. 11B is a cross-section view of the embodiment, taken along line A-A' as shown in FIG. 11A, and can correspond to that shown in FIG. 6B or 7B, the components of the 1D MEMS micro-mirror device are indicated using the same reference signs for the similar components as shown in FIG. 6B or 7B for the sake of illustration.

As shown in FIG. 11B, the MEMS micro-mirror device 900D (e.g., based on that indicated by 900, 900A, 900B, 900C, or 1000) can further include at least one flexible portion (e.g., 918a, 918b), disposed at a corresponding position on the upper cap 901 facing the first side of the stopper (e.g., 915a, 915b).

In FIG. 11B the MEMS micro-mirror device 900D (e.g., 900, 900A, 900B, 900C, or 1000) can further include at least one flexible portion (e.g., 916c, 916d), disposed at a corresponding position on the lower cap 921 facing the second side of the stopper (e.g., 915a, 915b).

In an example, spacers 932 can be optionally added to define a gap distance, indicated by g1, between the upper cap 901 and middle substrate 911. Spacers 93 can be optionally added to define a gap distance, indicated by g2, between the lower cap 921 and middle substrate 911.

Figure 11C:
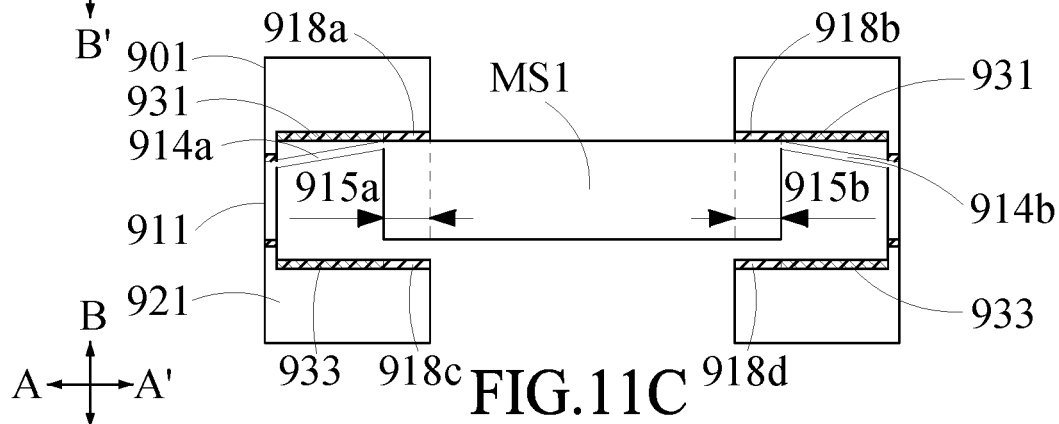
FIG. 11C is a schematic diagram illustrating the operation of the 1D MEMS micro-mirror device as shown in FIG. 11B.

The flexible portion is capable of relieving the stopper (e.g., 923 or 924; 1023 or 1024) from a shock-induced impact on the stopper. Regarding the operation of at least one flexible portion for further prevention of damage, upon exposed to shock in direction of B, the movable structure MS1 (e.g., the micro-mirror plate 912; or MS2) moves in the direction of B and stops when the stoppers 915a, 915b rest on the flexible portions 918a, 918b, as shown in FIG. 11C. Similarly, when exposed to shock in direction of B', the movable structure MS1 (e.g., the micro-mirror plate 912; or MS2) moves in the direction of B' and stops when the stoppers 915a, 915b rest on the flexible portions 918c, 918d, as shown in FIG. 8D.

In some embodiments, the flexible portion (e.g., 918a, 918b, 918c, or 918d) can be, but not limited to, any polymer such as Polydimethylsiloxane (PDMS), Poly(methyl methacrylate) (PMMA), polyimide, and epoxy such as SU8. The flexible portion can be disposed by screen printing, spin coating, spray coating, and dispensing, for example.

It is noted that the flexible portions (e.g., 918a, 918b, 918c, or 918d) are shown in FIG. 11B for the sake of illustration and brevity only. In further examples, at least one flexible portion may be implemented by using any appropriate element in a flat, concave, convex, or any appropriate shape, resided or configured on the upper cap 901 (or upper substrate) or lower cap 921 (or lower substrate). Certainly, the implementation of the invention is not limited to the above examples.

Figure 11D:
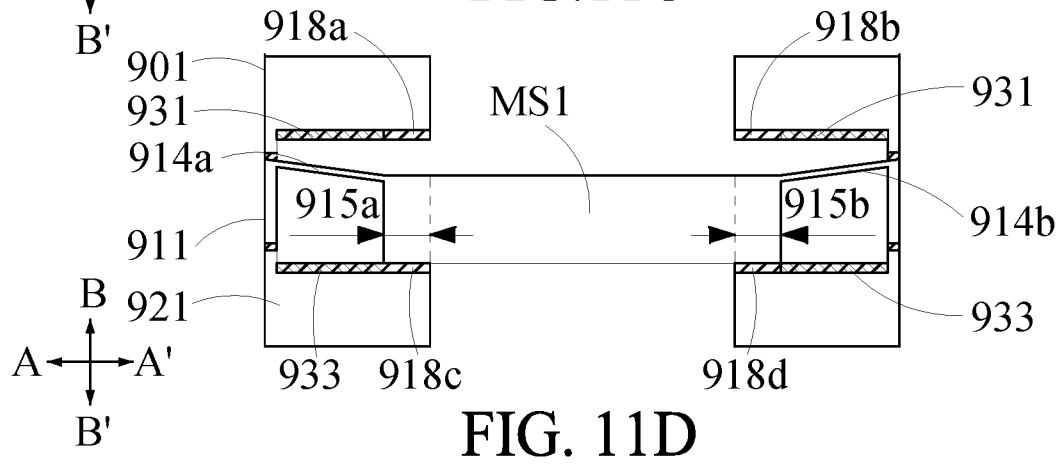
FIG. 11D is a schematic diagram illustrating the operation of the 1D MEMS micro-mirror device as shown in FIG. 11B.

In some embodiments, at least one flexible portion, for example, may be disposed on, at least in part or full, an inner surface of the upper cap 901 (or upper substrate), or that of lower cap 921 (or lower substrate), which defines the corresponding recess (e.g., 903, 904, 923 or 924). Referring to FIG. 11D, a flexible portion 931 (or 933) is provided on the inner surface of the upper cap 901 (or lower cap 921) and faces the first side of the flexure 914a, 914b (or the second of the flexure 914a, 914b). The flexible portions 931 and 918a (or 931 and 918b; 932 and 918c; or 932 and 918d), for example, may be implemented to be separated, connected, or as a whole flexible portion. In some embodiments, two or more flexible portions may be disposed on, at least in part or full, an inner surface of the upper cap 901 (or upper substrate), or that of lower cap 921 (or lower substrate), which defines the corresponding recess (e.g., 903, 904, 923 or 924).

In some embodiments, the flexible portion (e.g., 931, 918a) can be implemented to have an appropriate thickness less than the depth of the corresponding recess such that a gap can be defined between the flexible portion and the first side (or second side) of the stopper (e.g., 915a or 915b), regardless of whether spacers are employed or not.

In the above embodiments as shown or based on FIG. 6A, 7A, 8A, 9A, 10A, or 11A, the micro-mirror plate has a spring constant which is determined, at least in part, based on the dimension of the flexure.

In some embodiments, a MEMS package can be provided, comprising a MEMS micro-mirror device (e.g., 900, 900A, 900B, 900C, 900D, or 1000), as described in any one of the embodiments of the present disclosure or any combination thereof, a light source, and an on-package optical angle sensor.

Figure 12:
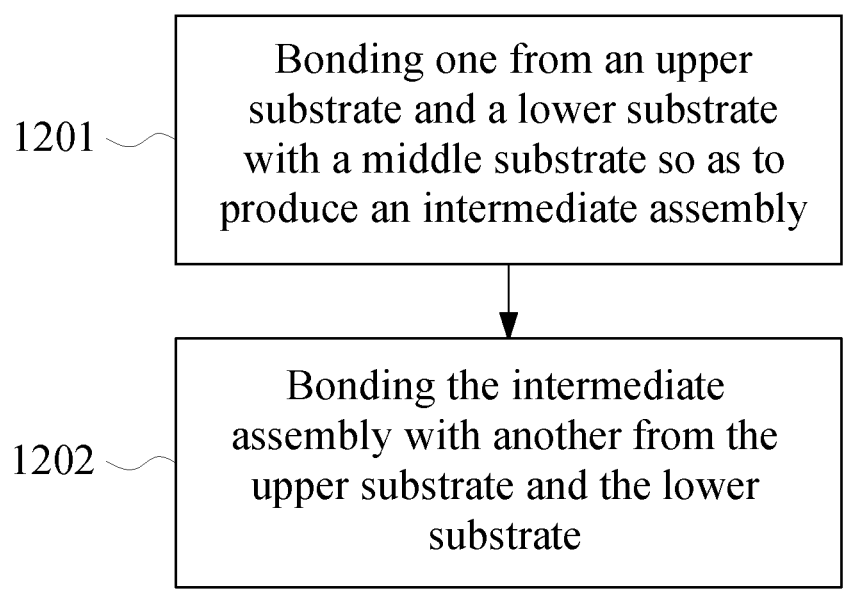
FIG. 12 is an embodiment of a method of making the MEMS micro-mirror device.

FIG. 12 shows a method of making a MEMS mirror device, such as that as exemplified in FIG. 6, 7, 8, 9, 10, or 11. The MEMS mirror device, for example, may include an upper cap (or upper substrate), a middle substrate, and a lower cap (or lower substrate). The upper and lower caps (or substrate) can be, but not limited to, silicon, glass, borosilicate, quartz, plastic substrate, organic mold and metal mold. The plastic substrate can be formed by resin molding. Organic mold can be made by 3D printing. Metal mold can be machined by Computer Numerical Control (CNC) machining. The middle substrate can be silicon. The upper and lower caps (or substrate) can be bonded with the middle substrate by using, but not limited to, anodic bonding, glass frit bonding, solder bonding, eutectic bonding, resist bonding, fusion bonding, glass bonding, polymer bonding, and thermo-compression bonding.

In an embodiment, a method of making a MEMS micro-mirror device includes the following indicated in block 1201 and 1202.

In block 1201, performed is bonding one from an upper substrate (or an upper cap) and a lower substrate (or a lower cap) with a middle substrate so as to produce an intermediate assembly.

Then, in block 1202, bonding the intermediate assembly with another from the upper substrate and the lower substrate.

In accordance with the method, in an example, the upper substrate is bonded with the middle substrate so as to produce an intermediate assembly, and the intermediate assembly is then bonded with the lower substrate. A MEMS micro-mirror device can be made based on the intermediate assembly bonded with the lower substrate. In another example, the lower substrate is bonded with the middle substrate so as to produce an intermediate assembly, and the intermediate assembly is then bonded with the upper substrate. A MEMS micro-mirror device can be made based on the intermediate assembly bonded with the lower substrate.

In the above method, for example, at least one stopper is coupled with a movable structure including a micro-mirror plate which has at least one reflective surface; and at least one flexure connects the stopper and the middle substrate. The upper substrate, for example, has a first opening for allowing space for movement of the movable structure, and has at least one first recess for facing a first side of the flexure and a first side of the stopper. The lower substrate, for example, has a second opening for allowing space for movement of the movable structure, and has at least one second recess for facing a second side of the flexure and a second side of the stopper.

In an embodiment of the method, after the intermediate assembly is bonded with the second one from the upper substrate and the lower substrate, the first recess has a corresponding gap from the first side of the flexure, for example, as illustrated in FIG. 6B, 7B 8B, 9B, 10B, or 11B.

In an embodiment of the method, after the intermediate assembly is bonded with the second one from the upper substrate and the lower substrate, the second recess has a corresponding gap from the second side of the stopper (e.g., as illustrated in FIG. 6B, 7B, 8B, 9B, 10B, or 11B).

In an embodiment of the method, the stopper is coupled with the micro-mirror plate of the movable structure, wherein the micro-mirror plate is capable of being actuated to rotate in an axis that is defined by the flexure (e.g., as illustrated in FIG. 6A, 7A, 8A, or 9A).

In an embodiment of the method, the flexure is at least one first flexure, and the movable structure further includes: a gimbal, and at least one second flexure, connecting the micro-mirror plate and the gimbal, wherein the stopper is coupled with the gimbal of the movable structure and the micro-mirror plate is capable of being actuated to rotate in a first axis defined by the first flexure and in a second axis defined by the second flexure (e.g., as illustrated in FIGS. 10A and 10B).

In an embodiment of the method, the upper substrate is provided with at least one protrusion, which is disposed at a corresponding position on the upper substrate, for facing the first side of the stopper (e.g., as illustrated in FIG. 8B).

In an embodiment of the method, the lower substrate is provided with at least one protrusion, which is disposed at a corresponding position on the lower substrate, for facing the second side of the stopper (e.g., as illustrated in FIG. 8B).

In an embodiment of the method, the stopper is provided with at least one protrusion which is disposed at a position on the first side of the stopper (e.g., as illustrated in FIG. 9B).

In an embodiment of the method, the stopper is provided with at least one protrusion which is disposed at a position on the second side of the stopper (e.g., as illustrated in FIG. 9B).

In an embodiment of the method, the upper substrate is provided with at least one flexible portion, disposed at a corresponding position on the upper substrate, for facing the first side of the stopper (e.g., as illustrated in FIG. 11B).

In an embodiment of the method, the lower substrate is provided with at least one flexible portion, disposed at a corresponding position on the lower substrate, for facing the second side of the stopper (e.g., as illustrated in FIG. 11B).

In an embodiment of the method, the corresponding thickness of the stopper is substantially equal to that of middle substrate.

In an embodiment of the method, the micro-mirror plate has a spring constant which is determined, at least in part, based on dimension of the flexure.

In an embodiment of the method, the stopper has a corresponding thickness substantially greater than that of the flexure.

The examples or embodiments of the upper substrate (or an upper cap), the lower substrate (or a lower cap), and the middle substrate can be taken from any one of the embodiments of the above as shown in FIG. 6A-6B, 7A-7D, 8A-8D, 9A-9D, 10A-10B, 11A-11D, or any related recitation above, or any combination thereof, whenever appropriate.

Figure 13:
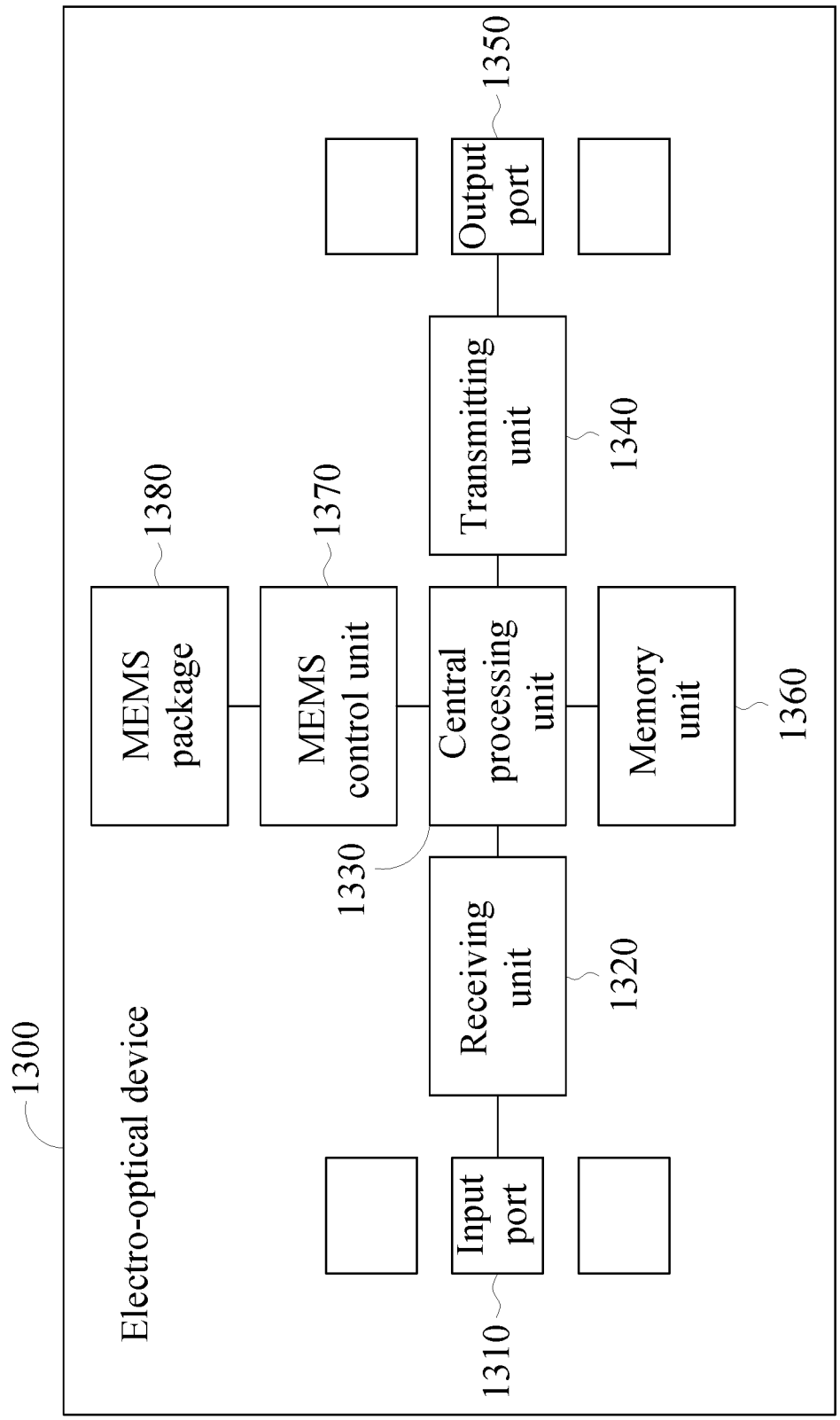
FIG. 13 is a schematic illustration of an embodiment of an electro-optical device.

FIG. 13 is a schematic diagram of an electro-optical device. The electro-optical device 1300 comprises input ports 1310 and at least one receiving unit (Rx) 1320, a central processing unit 1330; at least one transmitting unit (Tx) 1340, output ports 1350, a memory unit 1360, a MEMS control unit 1370, and a MEMS package 1380. The MEMS package 1380 can be implemented based on a MEMS micro-mirror device (e.g., 900, 900A, 900B, 900C, 900D, or 1000), as described in any one of the embodiments of the present disclosure or any combination thereof.

The central processing unit 1330 processes data implementing by one or more programmable chip(s) such as field-programmable gate arrays (FPGAs), application-specific integrated circuits (ASICs), or digital signal processors (DSPs). The central processing unit 1330 inputs data or control signals from the input ports 1310 through the receiving ports 1320. The central processing unit 1330 also stores and retrieves data or programs to and from the memory unit 1360. The memory unit 1360 can be in the form of solid-state drives, flash memory, or any memory whenever appropriate. The memory unit 1360, for example, may include at least one from volatile, non-volatile, read-only memory (ROM), random access memory (RAM), ternary content-addressable memory (TCAM), static random-access memory (SRAM), or combination thereof. The central processing unit 1330 also exports data to output ports 1350 through transmitting unit 1340. The central processing unit 1330 communicates with the MEMS control unit 1370 which in turn controls the MEMS package 1380.

While the present disclosure has been described by means of specific embodiments, numerous modifications and variations could be made thereto by those skilled in the art without departing from the scope and spirit of the present disclosure set forth in the claims.

What is claimed is:

1. A micro-electromechanical system (MEMS) micro-mirror device, comprising:
   a middle substrate;
   a movable structure including a micro-mirror plate which has at least one reflective surface;
   at least one stopper, disposed on at least one side of the movable structure where the at least one side is perpendicular to an axis of an at least one flexure;
   the at least one flexure directly connected to the at least one stopper, the at least one flexure connecting the at least one stopper and the middle substrate, where the at least one stopper is perpendicular to the axis of the at least one flexure;
   an upper cap, bonded with the middle substrate, having
      a first opening for allowing space for movement of the movable structure, and
      at least one first recess for facing a first side of the flexure and a first side of the stopper; and
   a lower cap, bonded with the middle substrate, having
      a second opening for allowing space for movement of the movable structure, and
      at least one second recess for facing a second side of the flexure and a second side of the stopper.

2. The MEMS micro-mirror device according to claim 1, wherein the first recess has a corresponding gap from the first side of the flexure so as to stop the flexure from moving out of plane upon exposing to out of plane shock, and where the at least one stopper does not limit normal rotational motion of the movable structure.

3. The MEMS micro-mirror device according to claim 1, wherein at least one second recess has a corresponding gap from the second side of the stopper so as to stop the flexure from moving out of plane upon exposing to shock.

4. The MEMS micro-mirror device according to claim 1, wherein the stopper is coupled with the micro-mirror plate of the movable structure, wherein the micro-mirror plate is capable of being actuated to rotate in an axis that is defined by the flexure.

5. The MEMS micro-mirror device according to claim 1, wherein the flexure is at least one first flexure, and the movable structure further includes:
   a gimbal, and
   at least one second flexure, connecting the micro-mirror plate and the gimbal,
   wherein the stopper is coupled with the gimbal of the movable structure, and the micro-mirror plate is capable of being actuated to rotate in a first axis defined by the first flexure and in a second axis defined by the second flexure.

6. The MEMS micro-mirror device according to claim 1, further comprising:

at least one protrusion, disposed at a corresponding position on the upper cap, for facing the first side of the stopper.

7. The MEMS micro-mirror device according to claim 1, further comprising:
at least one protrusion, disposed at a corresponding position on the lower cap, for facing the second side of the stopper.

8. The MEMS micro-mirror device according to claim 1, further comprising:
at least one protrusion, disposed at a position on the first side of the stopper.

9. The MEMS micro-mirror device according to claim 1, further comprising:
at least one protrusion, disposed at a position on the second side of the stopper.

10. The MEMS micro-mirror device according to claim 1, further comprising:
at least one flexible portion, disposed at a corresponding position on the upper cap, for facing the first side of the stopper.

11. The MEMS micro-mirror device according to claim 1, further comprising:
at least one flexible portion, disposed at a corresponding position on the lower cap, for facing the second side of the stopper.

12. The MEMS micro-mirror device according to claim 1, wherein the corresponding thickness of the stopper is substantially equal to that of the middle substrate.

13. The MEMS micro-mirror device according to claim 1, wherein the micro-mirror plate has a spring constant which is determined, at least in part, based on dimension of the flexure.

14. The MEMS micro-mirror device according to claim 1, wherein the stopper has a corresponding thickness substantially greater than that of the flexure.

15. A method of making a MEMS micro-mirror device, comprising:
bonding one from an upper substrate and a lower substrate with a middle substrate so as to produce an intermediate assembly; and
bonding the intermediate assembly with another from the upper substrate and the lower substrate;
wherein at least one stopper is coupled with a movable structure including a micro-mirror plate which has at least one reflective surface; and at least one flexure is provided to connect the stopper and the middle substrate;
wherein the at least one stopper is disposed on at least one side of the movable structure where the at least one side is perpendicular to an axis of the at least one flexure;
wherein the at least one flexure is directly connected to the at least one stopper, the at least one flexure connecting the at least one stopper and the middle substrate, where the at least one stopper is perpendicular to the axis of the at least one flexure;
wherein the upper substrate has a first opening for allowing space for movement of the movable structure and has at least one first recess for facing a first side of the flexure and a first side of the stopper; and
wherein the lower substrate has a second opening for allowing space for movement of the movable structure and has at least one second recess for facing a second side of the flexure and a second side of the stopper.

16. The method according to claim 15, wherein after the intermediate assembly is bonded with the second one from the upper substrate and the lower substrate, the first recess has a corresponding gap from the first side of the flexure.

17. The method according to claim 15, wherein after the intermediate assembly is bonded with the second one from the upper substrate and the lower substrate, the second recess has a corresponding gap from the second side of the stopper.

18. The method according to claim 15, wherein the stopper is coupled with the micro-mirror plate of the movable structure, wherein the micro-mirror plate is capable of being actuated to rotate in an axis that is defined by the flexure.

19. The method according to claim 15, wherein the flexure is at least one first flexure, and the movable structure further includes:
a gimbal, and
at least one second flexure, connecting the micro-mirror plate and the gimbal,
wherein the stopper is coupled with the gimbal of the movable structure and the micro-mirror plate is capable of being actuated to rotate in a first axis defined by the first flexure and in a second axis defined by the second flexure.

20. The method according to claim 15, wherein the upper substrate is provided with at least one protrusion, which is disposed at a corresponding position on the upper substrate, for facing the first side of the stopper.

21. The method according to claim 15, wherein the lower substrate is provided with at least one protrusion, which is disposed at a corresponding position on the lower substrate, for facing the second side of the stopper.

22. The method according to claim 15, wherein the stopper is provided with at least one protrusion disposed at a position on the first side of the stopper.

23. The method according to claim 15, wherein the stopper is provided with at least one protrusion disposed at a position on the second side of the stopper.

24. The method according to claim 15, wherein the upper substrate is provided with at least one flexible portion, disposed at a corresponding position on the upper substrate, for facing the first side of the stopper.

25. The method according to claim 15, wherein the lower substrate is provided with at least one flexible portion, disposed at a corresponding position on the lower substrate, for facing the second side of the stopper.

26. The method according to claim 15, wherein the corresponding thickness of the stopper is substantially equal to that of middle substrate.

27. The method according to claim 15, wherein the micro-mirror plate has a spring constant which is determined, at least in part, based on dimension of the flexure.

28. The method according to claim 15, wherein the stopper has a corresponding thickness substantially greater than that of the flexure.

29. A micro-electromechanical system (MEMS) micro-mirror device, comprising:
a middle substrate;
a movable structure including a micro-mirror plate which has at least one reflective surface;
at least one stopper, coupled with the movable structure;
at least one flexure, connecting the stopper and the middle substrate;
an upper cap, bonded with the middle substrate, having
a first opening for allowing space for movement of the movable structure, and
at least one first recess for facing a first side of the flexure and a first side of the stopper; and a lower cap, bonded with the middle substrate, having
a second opening for allowing space for movement of the movable structure, and
at least one second recess for facing a second side of the flexure and a second side of the stopper;
wherein the flexure is at least one first flexure, and the movable structure further includes:
a gimbal, and
at least one second flexure, connecting the micro-mirror plate and the gimbal,
wherein the stopper is coupled with the gimbal of the movable structure, and the micro-mirror plate is capable of being actuated to rotate in a first axis defined by the first flexure and in a second axis defined by the second flexure.

30. A method of making a MEMS micro-mirror device, comprising:
bonding one from an upper substrate and a lower substrate with a middle substrate so as to produce an intermediate assembly; and
bonding the intermediate assembly with another from the upper substrate and the lower substrate;
wherein at least one stopper is coupled with a movable structure including a micro-mirror plate which has at least one reflective surface; and at least one flexure is provided to connect the stopper and the middle substrate;
wherein the upper substrate has a first opening for allowing space for movement of the movable structure and has at least one first recess for facing a first side of the flexure and a first side of the stopper;
wherein the lower substrate has a second opening for allowing space for movement of the movable structure and has at least one second recess for facing a second side of the flexure and a second side of the stopper; and
wherein the flexure is at least one first flexure, and the movable structure further includes:
a gimbal, and
at least one second flexure, connecting the micro-mirror plate and the gimbal,
wherein the stopper is coupled with the gimbal of the movable structure and the micro-mirror plate is capable of being actuated to rotate in a first axis defined by the first flexure and in a second axis defined by the second flexure.

* * * * *